(12) United States Patent
Top et al.

(10) Patent No.: US 8,643,378 B2
(45) Date of Patent: Feb. 4, 2014

(54) METHOD OF PERFORMING ELECTROSTATIC DISCHARGE TESTING ON A PAYMENT CARD

(75) Inventors: Mustafa Top, Foster City, CA (US); Edward Kurtek, Fremont, CA (US); Johan Ras, Foster City, CA (US); Dung Huynh, Campbell, CA (US); Stan Weitz, Glenside, PA (US); Chris Stanley Nelson, Foster City, CA (US)

(73) Assignee: Visa International Service Association, San Francisco, CA (US)

( * ) Notice: Subject to any disclaimer, the term of this patent is extended or adjusted under 35 U.S.C. 154(b) by 363 days.

(21) Appl. No.: 13/012,459

(22) Filed: Jan. 24, 2011

(65) Prior Publication Data

US 2011/0210723 A1    Sep. 1, 2011

Related U.S. Application Data

(62) Division of application No. 12/016,947, filed on Jan. 18, 2008, now Pat. No. 7,902,831.

(60) Provisional application No. 60/885,764, filed on Jan. 19, 2007.

(51) Int. Cl.
  *G01N 27/60* (2006.01)
  *G06K 7/00* (2006.01)

(52) U.S. Cl.
  USPC .......................................... 324/452; 235/438

(58) Field of Classification Search
  USPC ....................................................... 324/452
  See application file for complete search history.

(56) References Cited

U.S. PATENT DOCUMENTS

| 5,136,247 | A | 8/1992 | Hansen |
| 5,373,146 | A * | 12/1994 | Lei ............................. 235/382.5 |
| 6,189,791 | B1 | 2/2001 | Takita et al. |
| 6,318,632 | B1 * | 11/2001 | Grant et al. ................... 235/441 |
| 7,902,831 | B2 | 3/2011 | Top et al. |
| 2003/0065403 | A1 * | 4/2003 | Meyer et al. .................... 623/38 |
| 2003/0218813 | A1 * | 11/2003 | Dakroub ......................... 360/25 |
| 2006/0072355 | A1 * | 4/2006 | Ebihara et al. ................. 365/149 |
| 2007/0201174 | A1 * | 8/2007 | Hynes et al. .................... 361/56 |

(Continued)

FOREIGN PATENT DOCUMENTS

EP    0 268 602    10/1993

OTHER PUBLICATIONS

Fujiwara, O, et al.: "A Realistic FDTD Model for Simulating Electrostatic Discharge Test," Radio Science Conference, 2004. Proceedings. 2004 Asia-Pacific Qingdao, China, Aug. 24-27, 2004, Piscataway, NY, USA IEEE, Aug. 24, 2004, pp. 523-523.

(Continued)

*Primary Examiner* — Jeff Natalini
(74) *Attorney, Agent, or Firm* — Kilpatrick Townsend & Stockton LLP

(57) ABSTRACT

Methods of performing electrostatic discharge testing on a transaction card are disclosed. A transaction card may be placed on an insulated surface. A grounding probe may be placed at a first location on the transaction card. A discharge probe may be charged to a known voltage level. The discharge probe may then be discharged at a second location on the transaction card. A discharge wave shape may be recorded from the ground probe, and one of a pass condition and a fail condition may be assigned based on at least the value of the known voltage level as compared to a reference voltage level. The first location and the second location may each be selected from a plurality of areas on the transaction card.

19 Claims, 15 Drawing Sheets

(56) References Cited

U.S. PATENT DOCUMENTS

| | | |
|---|---|---|
| 2008/0265040 A1 | 10/2008 | Holmes et al. |
| 2009/0250521 A1 | 10/2009 | Fujita et al. |
| 2010/0065637 A1 | 3/2010 | Top et al. |

OTHER PUBLICATIONS

Wallash, Al et al: "Electrostatic Discharge Testing of Tunneling Magnetoresistive (TMR) Devices," IEEE Transactions on Magnetics, IEEE Service Center, New York, NY, US, vol. 36, No. 5, Sep. 1, 2000.

Weil G: "Characterization and Test Methods for Printed Circuit Board ESD," 19900821; 19900821-19900823, Aug. 21, 1990, pp. 124-129.

Ananymous: "Protecting Chip Cards Against Electrostatic Discharge," IBM Technical Disclosure Bulletin, vol. 26, No. 10A, Mar. 1, 1984, pp. 5091-5093.

\* cited by examiner

METHOD OF PERFORMING ELECTROSTATIC DISCHARGE TESTING ON A PAYMENT CARD

CROSS-REFERENCES TO RELATED APPLICATIONS

This application is a divisional of U.S. patent application Ser. No. 12/016,947 filed Jan. 18, 2008, entitled "Methods of Performing Electrostatic Discharge Testing on a Payment Card," now U.S. Pat. No. 7,902,831, which claims priority to U.S. Provisional Application Ser. No. 60/885,764 filed Jan. 19, 2007, entitled, "Methods of Performing Electrostatic Discharge," both of which are hereby incorporated by reference for all purposes.

BACKGROUND

Electrostatic discharge (ESD) is a sudden and momentary electric current that occurs when an excess of electric charge stored on an electrically insulated or non-insulated object flows to an object at a different electrical potential, such as ground. ESD is a serious issue in solid state electronics, particularly when a momentary unwanted current causes damage to electronic equipment.

One type of object on which electric charge can accumulate is a transaction card, such as a credit card, debit card, smart card, contactless card, loyalty card, payment card and the like. Such cards are typically brought into contact with electronic devices, such as point of sale terminals. Accordingly, if an electric charge has built up on a transaction card, electrostatic discharge from the card into the electronic device can damage the device. In some cases, ESD can cause the electronic device to fail to perform a payment transaction.

Such cards can also act as a conduit between objects having different electrical potentials, such as a user's body and a payment card reader device. Transaction cards are typically brought into contact with electronic devices, such as point of sale terminals, and provide a conduit between an electrically charged user's body and a card reader device. As such, if an electric charge has been generated on the user's body and/or other objects, an electrostatic discharge may be generated from the user into the electronic device through the user's skin, the card and the card's conductive elements while the card is in contact with the card reading device. Such electrostatic discharge can damage the device. In some cases, the electrostatic discharge can cause the electronic device to fail to perform a payment transaction either temporarily or permanently.

As such, methods of determining the amount of ESD emitted by a transaction card and methods of determining whether the amount of discharged electrical charge could cause damage to an electronic device would be desirable.

BRIEF SUMMARY

Before the present embodiments, methods, and materials are described, it is to be understood that this disclosure is not limited to the particular embodiments, methodologies, and materials described, as these may vary. It is also to be understood that the terminology used in the description is for the purpose of describing the particular embodiments only, and is not intended to limit the scope.

It must also be noted that as used herein and in the appended claims, the singular forms "a," "an," and "the" include plural references unless the context clearly dictates otherwise. Thus, for example, reference to a "card" is a reference to one or more cards and equivalents thereof known to those skilled in the art, and so forth. Unless defined otherwise, all technical and scientific terms used herein have the same meanings as commonly understood by one of ordinary skill in the art. Although any methods, materials, and devices similar or equivalent to those described herein can be used in the practice or testing of embodiments, the preferred methods, materials, and devices are now described. All publications mentioned herein are incorporated by reference in their entireties. Nothing herein is to be construed as an admission that the embodiments described herein are not entitled to antedate such disclosure by virtue of prior invention. As used herein, the term "comprising" means "including, but not limited to."

In an embodiment, a method of performing electrostatic discharge testing on a transaction card may include placing a transaction card on an insulated surface, placing a grounding probe at a first location on the transaction card, charging a discharge probe to a known voltage level, discharging the discharge probe at a second location on the transaction card, recording a discharge wave shape from the ground probe, and assigning one of a pass condition and a fail condition to the transaction card based on at least the value of the known voltage level as compared to a reference voltage level. The first location and the second location may each be selected from a plurality of areas on the transaction card.

In an embodiment, a method of performing electrostatic discharge testing on a transaction card may include placing a transaction card having a magnetic stripe on an insulated surface, placing a grounding probe on the magnetic stripe along a first edge of the transaction card, charging a discharge probe to a known voltage level, discharging the discharge probe on the magnetic stripe along a second edge, which is opposite the first edge, of the transaction card, recording a discharge wave shape from the ground probe, and assigning one of a pass condition and a fail condition to the transaction card at least based on whether the discharge wave shape is substantially similar to a reference discharge wave shape.

In an embodiment, a method of performing electrostatic discharge testing on a transaction card may include connecting a read head, comprising a shell and one or more pins, to a ground voltage level, charging a discharge probe to a known voltage level, discharging, at a first location on the transaction card, the discharge probe onto a transaction card held by an operator to charge the transaction card and the operator to the known voltage level, placing the transaction card in contact with the read head at a second location on the transaction card, recording a discharge wave shape from the ground probe, and assigning one of a pass condition and a fail condition to the transaction card based on at least the value of the known voltage level as compared to a reference voltage level. The first location and the second location may each be selected from a plurality of areas on the transaction card.

In an embodiment, a method of performing electrostatic discharge testing on a transaction card may include charging a discharge probe to a known voltage level, discharging, at a first location on the transaction card, the discharge probe onto a transaction card held by an operator to charge the transaction card and the operator to the known voltage level, placing the transaction card in contact with a read head of a terminal at a second location on the transaction card, determining whether the terminal exhibits an abnormality, and, if so, assigning one of a pass condition and a fail condition to the transaction card based on at least the value of the known voltage level as compared to a reference voltage level.

In an embodiment, a method of performing electrostatic discharge testing on a transaction card may include charging a discharge probe to a known voltage level, discharging, at a first location on the transaction card, the discharge probe onto a transaction card held by an operator to charge the transaction card and the operator to the known voltage level, placing the transaction card in contact with a read head of a terminal at a second location on the transaction card, recording a peak voltage and a voltage wave shape at the read head, and assigning one of a pass condition and a fail condition to the transaction card based on at least the value of the known voltage level as compared to a reference voltage level.

In an embodiment, a method of performing electrostatic discharge testing on a transaction card may include charging a transaction card to a known voltage level, swiping the transaction card through a terminal, and assigning one of a pass condition and a fail condition to the transaction card based on whether an abnormality occurs.

In an embodiment, a method of performing electrostatic discharge testing on a transaction card may include charging a magnetic stripe on a transaction card to a known voltage level, swiping the transaction card through a terminal, and assigning one of a pass condition and a fail condition to the transaction card based on whether an abnormality occurs.

In an embodiment, a method of performing electrostatic discharge testing on a transaction card may include rubbing the transaction card against a conductive material, swiping the transaction card through a terminal, and assigning one of a pass condition and a fail condition to the transaction card based on whether an abnormality occurs.

In an embodiment, a method of performing electrostatic discharge testing on a transaction card may include placing the transaction card on a metal surface such that a first side of the transaction card contacts the metal surface and a second side, having a magnetic stripe and opposite the first side, does not contact the metal surface, determining a capacitance for the transaction card, assigning one of a pass condition and a fail condition to the transaction card based on whether the capacitance exceeds a threshold value.

BRIEF DESCRIPTION OF THE DRAWINGS

Aspects, features, benefits and advantages of the present invention will be apparent with regard to the following description and accompanying drawings, of which.

DETAILED DESCRIPTION

Figure 1A:
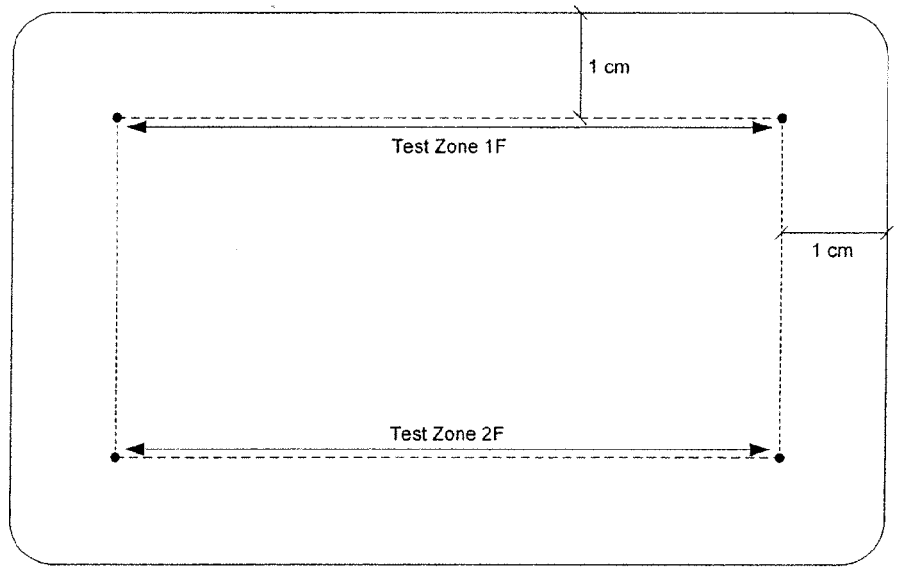
FIGS. 1A and 1B depict exemplary test zones for card edge measurements according to an embodiment.

As used herein, an unidentified component refers to a component on a transaction card for which ESD testing has not previously been performed.

One or more tests may be performed to assist in identifying any interruption of payment transactions caused by transaction cards, particularly those with unidentified components and elements. In addition, such tests may identify potential damage that could result when the transaction card is introduced into a terminal. In an embodiment, any element of a transaction card that indicates electrical attributes that differ from a magnetic stripe may be considered an unidentified component for the purposes of this test. Transaction card components that may be considered unidentified components may include, but are not limited to, a card's self-powering circuitry, displays, sensors, holograms or any other visual component in or on a transaction card.

The one or more tests may provide a basis for identifying any interruption to a transaction in a device normal process caused by a transaction card with unidentified components. The tests may compare the performance of a transaction card with unidentified elements against the performance of a carbon-based magnetic stripe card in terms of electrical attributes during an ESD event on the card. In an embodiment, if the transaction card with unidentified elements performs substantially equivalently to the carbon-based magnetic stripe card, the transaction card with unidentified elements may be considered to have passed the test.

For example, three test set-ups may be used to test a new transaction card: 1) an ESD model and magnitude comparison via a specially designed test setup not including a terminal, 2) an ESD magnitude and polarity comparison performed using a terminal read head, and 3) determining the voltage level developed on the transaction card when rubbed against another card, leather, nylon, cotton and/or other common clothing materials in order to provide an indication of the voltage levels and polarity of electric charge that develops on a transaction card during normal handling.

Based on the performance of a transaction card under a plurality of test conditions, a recommendation, in terms of the expected outcome of an ESD event occurrence for the card, may be provided. For example, if the transaction card performs substantially similarly to a carbon-based magnetic stripe card on all tests, the transaction card may be considered unlikely to cause a damaging ESD event. The performance of a carbon-based magnetic stripe card may be selected as a reference point because no reported incidents of terminal malfunction from ESD have occurs during more than 30 years using such cards.

Models for performing an ESD test may include one or more of the following: 1) IEC 61000-4-2 (Person holding a tool—150 pF/330 Ohms), 2) ANSI/ESD STM 5.1-2001 (Human Body Model—100 pF/1500 Ohms), 3) ANSI/ESD STM 5.2-1999 (Machine Model—200 pF/0 Ohms), and 4) ANSI/ESD STM 5.3 (Charged Device Model—Stripe capacitance/0 Ohms).

ISO 7810 is an international standard that defines three form factors for identity or identification cards: ID-1 (approximately 8.56 cm by approximately 5.4 cm), ID-2 (approximately 10.5 cm by approximately 7.4 cm), and ID-3 (approximately 12.5 cm by approximately 8.8 cm). The ID-1 form factor is often used for transaction cards, although other card form factors, including form factors not defined in ISO 7810, may be included within the scope of this disclosure.

Figure 1B:
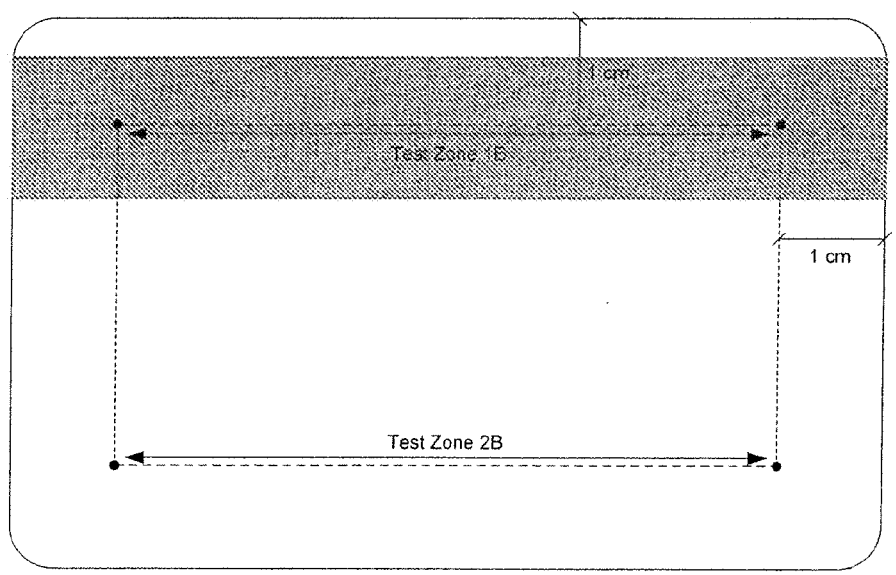

Different zones may be defined on a transaction card for testing purposes. A first zone ("Zone 1") may identify "unsafe" areas in which a magnetic stripe terminal read head directly contacts the card during a normal swipe or an upside-down swipe. The first zone may also represent the portion of the card that is held by a user when a card is swiped. As such, measurements may be made along a line between a first point that is 1 cm in from a first long card edge and 1 cm in from a first short card edge and a second point that is 1 cm in from the first long card edge and 1 cm in from a second short card edge on the front of the card ("Test Zone 1F"). A similar line defined by points measured from a second long card edge may also be measured ("Test Zone 2F"). In addition, the measurements may be performed on the back of the card ("Test Zones 1B and 2B"). The above-defined exemplary Test Zones for Zone 1 (i.e., Test Zones 1F, 2F, 1B and 2B) are depicted in FIGS. 1A and 1B.

Figure 2:
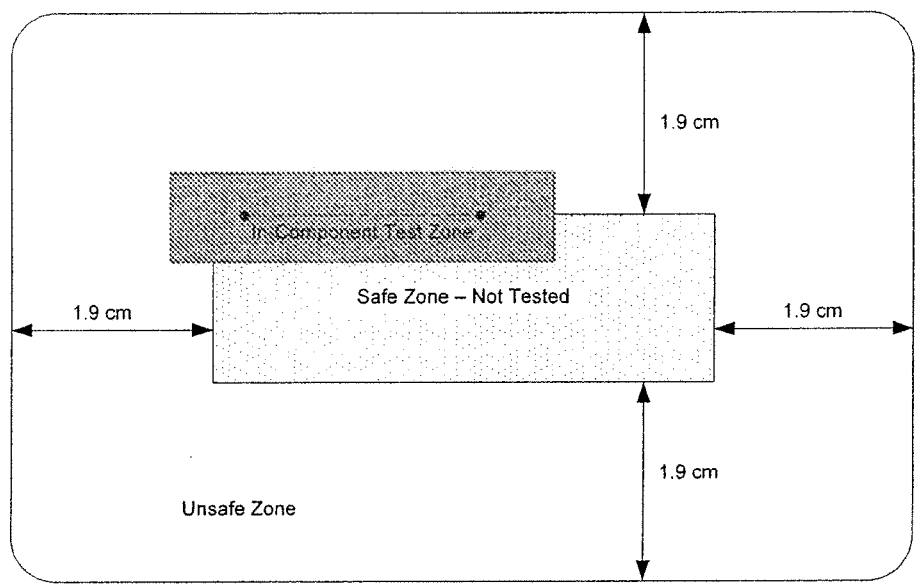
FIG. 2 depicts an exemplary test zone for card component measurements according to an embodiment.

A Safe Zone may be defined for a transaction card. The Safe Zone may be the area that is at least approximately 1.9 cm in from each of the two long edges and 1.9 cm in from each of the two short edges, as shown in FIG. 2. If an unidentified component is at least partially outside of the Safe Zone, two additional zones may be defined.

A second zone ("Zone 2") may be defined for on-component measurements. The second zone may be defined as a line from a first point that is approximately 0.5 cm inside a first short edge of the component to a second point that is approximately 0.5 cm inside a second short edge of the component. In an embodiment, the first and second points may be approximately halfway between the two long edges of the component. An exemplary second zone is depicted in FIG. 2.

Figure 3:
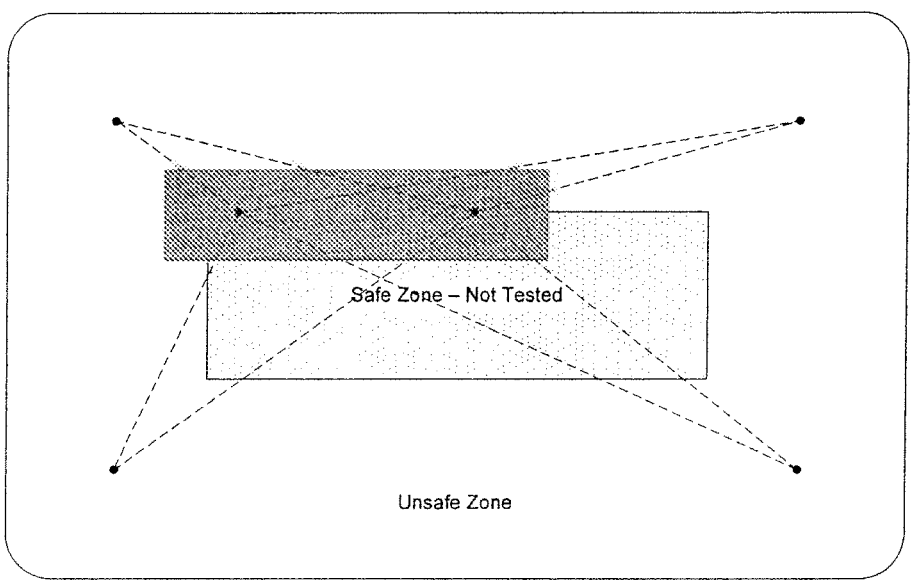
FIG. 3 depicts exemplary test zones for card edge to component measurements according to an embodiment.

A third zone ("Zone 3") may be defined by the points defined for Zone 1 and the points defined for Zone 2. The third zone may include the lines defined by each combination of Zone 1 points and Zone 2 points (8 total lines). An exemplary set of lines defining a third zone is depicted in FIG. 3.

Additional and/or alternate zones for testing may be used. For example, points at different distances from the edge of a transaction card may be selected. In addition, more or fewer points may be selected for each of the one or more zones. Such modifications will be apparent to those of ordinary skill in the art based on this disclosure.

For each test described below, one or more test conditions may be required to be satisfied in order to ensure reproducibility and reliability of the performed test. For example, the test environment may be required to have equal to or less than approximately 20% relative humidity. Furthermore, the transaction cards to be tested (and any control cards for pass and/or fail conditions) may be stored in an environment having approximately 12% relative humidity for at least 24 hours with enforced air around the cards. Testing personnel may be required to stand on an insulative substrate, such as polytetrafluoroethylene (Teflon® from E. I. du Pont de Nemours and Co.), polymethyl methacrylate (Plexiglas® from Rohm and Haas Co.) and/or polyethylene foam in order to prevent grounding. Additional and/or alternate test conditions may be imposed.

Each test may be performed with a plurality of test transaction cards and a plurality of control transaction cards. The test transaction cards may comprise a transaction card design that is being tested. The control transaction cards may include carbon-based magnetic stripe cards used as a reference for pass criteria. In an embodiment, the control transaction cards may include cards known to fail in operation, such as cards of a particular manufacture that discharge an amount of electrostatic energy that causes a terminal device to malfunction during operation under circumstances equivalent or similar to those being tested.

In an embodiment, one or more pass criteria may be defined for a test. For example, one criterion may be that the current discharged by the transaction card being tested must be less than approximately 500 mA when the transaction card is charged to approximately 5 kV. Another criterion may require the transaction card being tested to have a capacitance less than approximately 1 pF. Yet another criterion may be that the dynamic resistance for the transaction card being tested must be greater than approximately 1 kΩ Still another criterion may require that the discharge energy from the transaction card being tested be less than approximately 2 µJ. Another criterion may require that no disruption occur on ESD sensitive terminals used during charge and swipe tests. Yet another criterion may require that all cards being tested remain functional, including all visual component and/or transaction interface functionality, if any, after the test is completed. Additional and/or alternate criteria, including different values where applicable, may be used within the scope of this disclosure as will be apparent to one of ordinary skill in the art.

Figure 4:
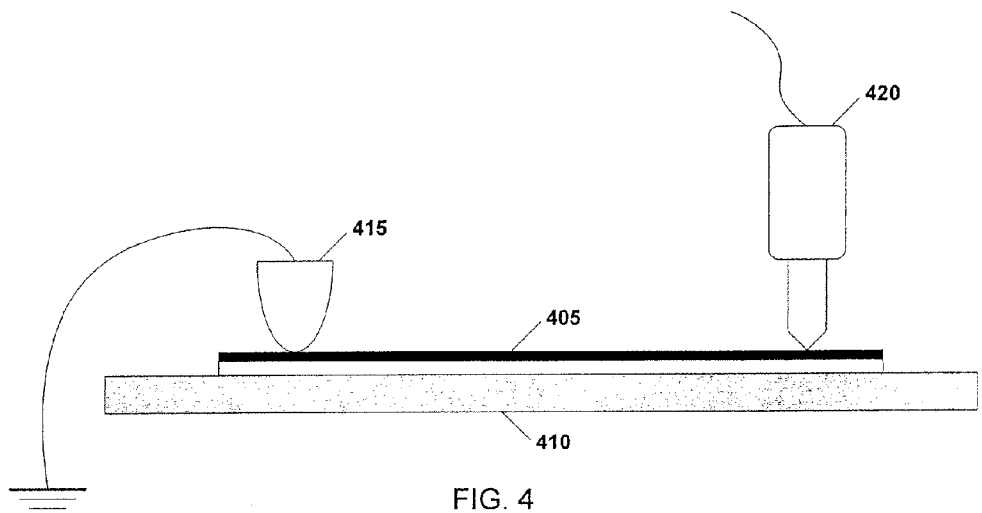
FIG. 4 depicts a first exemplary test setup for performing a test according to an embodiment.

FIG. 4 depicts a first exemplary test setup for performing a test according to an embodiment. As shown in FIG. 4, a card to be tested 405 may be placed on an insulative layer 410. A grounding probe 415 may be placed on the card 405 at a first test point, and a discharge probe 420 may be placed on the card at a second test point. The grounding probe 415 may be connected to ground and may be used to capture, for example, a current waveform, if any, when an ESD event occurs. The discharge probe 420 may be used to generate an ESD event at a known voltage level.

Figure 5:
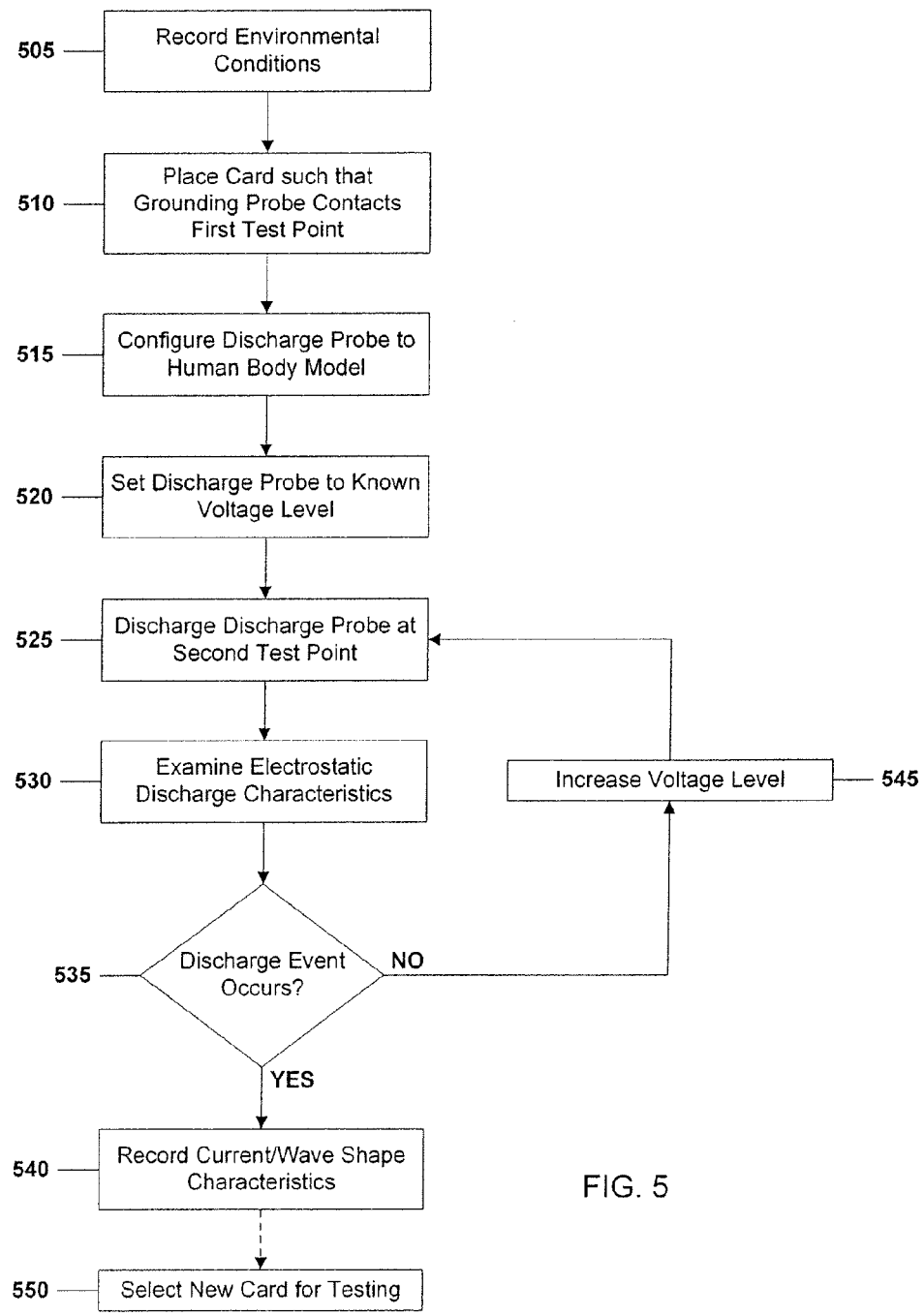
FIG. 5 depicts an exemplary method for performing an ESD waveform and magnitude with dielectric breakdown test according to an embodiment.

FIG. 5 depicts an exemplary method for performing an ESD waveform and magnitude with dielectric breakdown test according to an embodiment. As shown in FIG. 5, environmental conditions, such as the relative humidity and the temperature, may be recorded 505 prior to, during and/or after the test. A card 405 may be placed on the insulated surface 410 such that one stripe edge contacts 510 the grounding probe 415 at the first test point. The discharge probe 420 may be configured 515 to the Human Body Model. In an embodiment, the discharge probe 420 may have an adjustable voltage level. For example, the discharge probe 420 may initially be set 520 to a known voltage level, such as approximately 500 V. The discharge probe 420 may then be discharged 525 at the second test point. In an embodiment, the first and second test points may be selected based on one of the Test Zones defined by, for example, Zones 1, 2 and 3.

The ground line (i.e., the grounding probe 415) may be examined 530 during electrostatic discharge from the discharge probe 420 to determine 535 whether a discharge event occurs (i.e., to determine whether the current level is non-zero during the discharging of the discharge probe). If a discharge event occurs, the voltage level ($V_{EST}$), the peak current and/or the discharge wave shape of the current may be recorded 540. Otherwise, the voltage level of the discharge probe 420 may be increased 545 to a different voltage level, such as, for example, approximately 1 kV, 5 kV, 10 kV, 15 kV or 20 kV. Alternate and/or additional voltage levels for the discharge probe 420 may also be used within the scope of this disclosure. After the voltage level for the discharge probe 420 is increased 545, the discharge probe may again be discharged 525. In an embodiment, a period of time, such as at least approximately 2 minutes, may be required to elapse before the discharge probe 420 is discharged 525 at the increased voltage level.

If a discharge event occurs or no discharge event occurs at a maximum test voltage level, a new card 405 may be selected 550 for testing. In an embodiment, a plurality of test cards and a plurality of control cards may be tested. In an embodiment, the plurality of control cards may include a plurality of pass criteria cards and a plurality of fail criteria cards. In an embodiment, the test may be performed for each Test Zone defined by Zones 1, 2 and 3 for each card 405. In an embodiment, a test card 405 may be considered to pass the test if $V_{ESD}$ of the test card is comparable to $V_{ESD}$ of the pass criteria card and if no significant difference is noted between the discharge wave shape of the test card and the discharge wave shape of the pass criteria card. Additional and/or alternate criteria, including different values where applicable, may be used within the scope of this disclosure as will be apparent to one of ordinary skill in the art.

Figure 6:
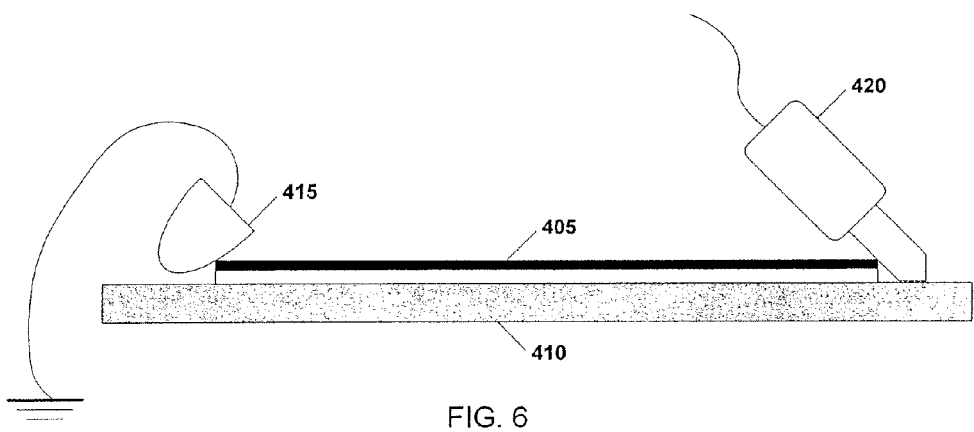
FIG. 6 depicts a second exemplary test setup for performing a test according to an embodiment.

FIG. 6 depicts a second exemplary test setup for performing a test according to an embodiment. As shown in FIG. 6, a card to be tested 405 may be placed on an insulative layer 410. A grounding probe 415 may be placed on the card 405 at a first test point, and a discharge probe 420 may be placed on the card at a second test point. The grounding probe 415 may be connected to ground and may be used to capture, for example, a current waveform, if any, when an ESD event occurs. The discharge probe 420 may be used to generate an ESD event at a known voltage level. The first test point may be along the edge of the card 405 and touching the magnetic stripe of the card. The second test point may be along the opposing edge of the card 405 and touching the magnetic stripe of the card.

Figure 7:
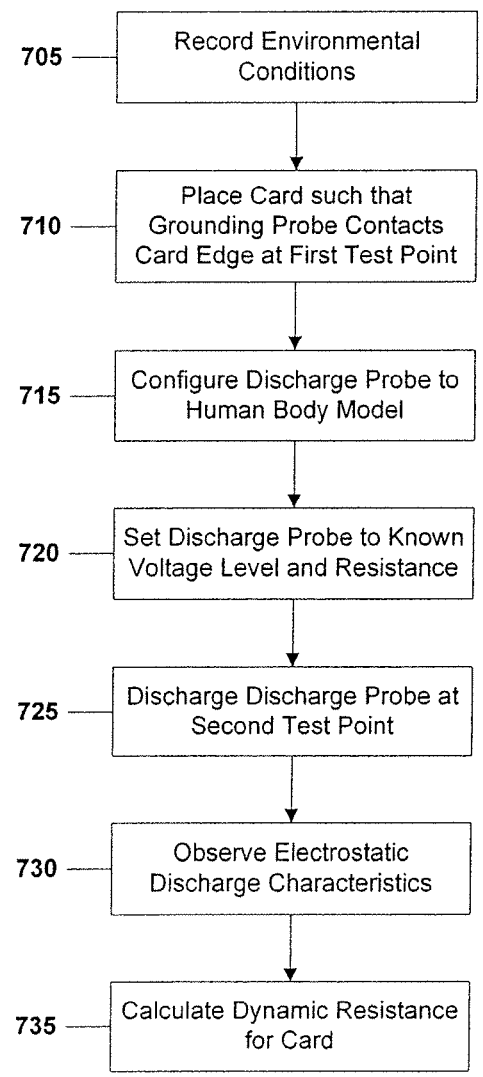
FIG. 7 depicts an exemplary method for performing an ESD waveform and magnitude with conductivity test according to an embodiment.

FIG. 7 depicts an exemplary method for performing an ESD waveform and magnitude with conductivity test according to an embodiment. As shown in FIG. 7, environmental conditions, such as the relative humidity and the temperature, may be recorded 705 prior to, during and/or after the test. A card 405 may be placed on the insulated surface 410 such that one stripe edge contacts 710 the grounding probe 415 at the first test point. The discharge probe 420 may be configured 715 to the Human Body Model. In an embodiment, the resistance of the discharge probe 420 may be adjustable. For example, the discharge probe 420 may initially be set 720 to approximately 1500Ω. In addition, the voltage level of the discharge probe 420 may be set 720 to approximately 5 kV. The discharge probe 420 may then be discharged 725 at the second test point. The discharge current may be observed 730 by examining a current waveform at the grounding probe 415. In an embodiment, the peak current and current waveform caused by the ESD discharge from the discharge probe 420 may be determined. The dynamic resistance may be calculated 735 by dividing the voltage level of the discharge probe 420 by the peak current in amps. The test may then be repeated with a resistance of approximately 0Ω for the discharge probe 420. Additional and/or alternate resistance levels and voltage levels for the discharge probe 420 may be used within the scope of this disclosure. The test may be repeated for each card 405 to be tested at each resistance level.

Figure 8:
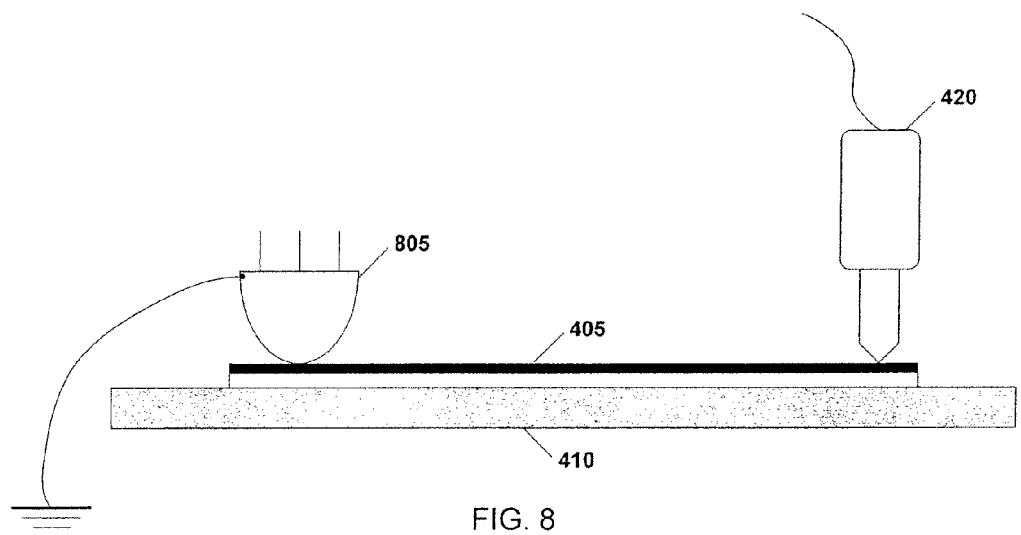
FIG. 8 depicts a third exemplary test setup for performing a test according to an embodiment.

FIG. 8 depicts a third exemplary test setup for performing a test according to an embodiment. As shown in FIG. 8, a card to be tested 405 may be placed on an insulative layer 410. A terminal read head 805 may be placed on the card 405 at a first test point, and a discharge probe 420 may be placed on the card at a second test point. The terminal read head 805 may be connected to ground via a ground line and may be used to capture, for example, current waveforms, if any, when an ESD event occurs. Current waveforms may be captured, for example, from a pin and the shell of the terminal read head 805. The discharge probe 420 may be used to generate an ESD event at a known voltage level.

Figure 9:
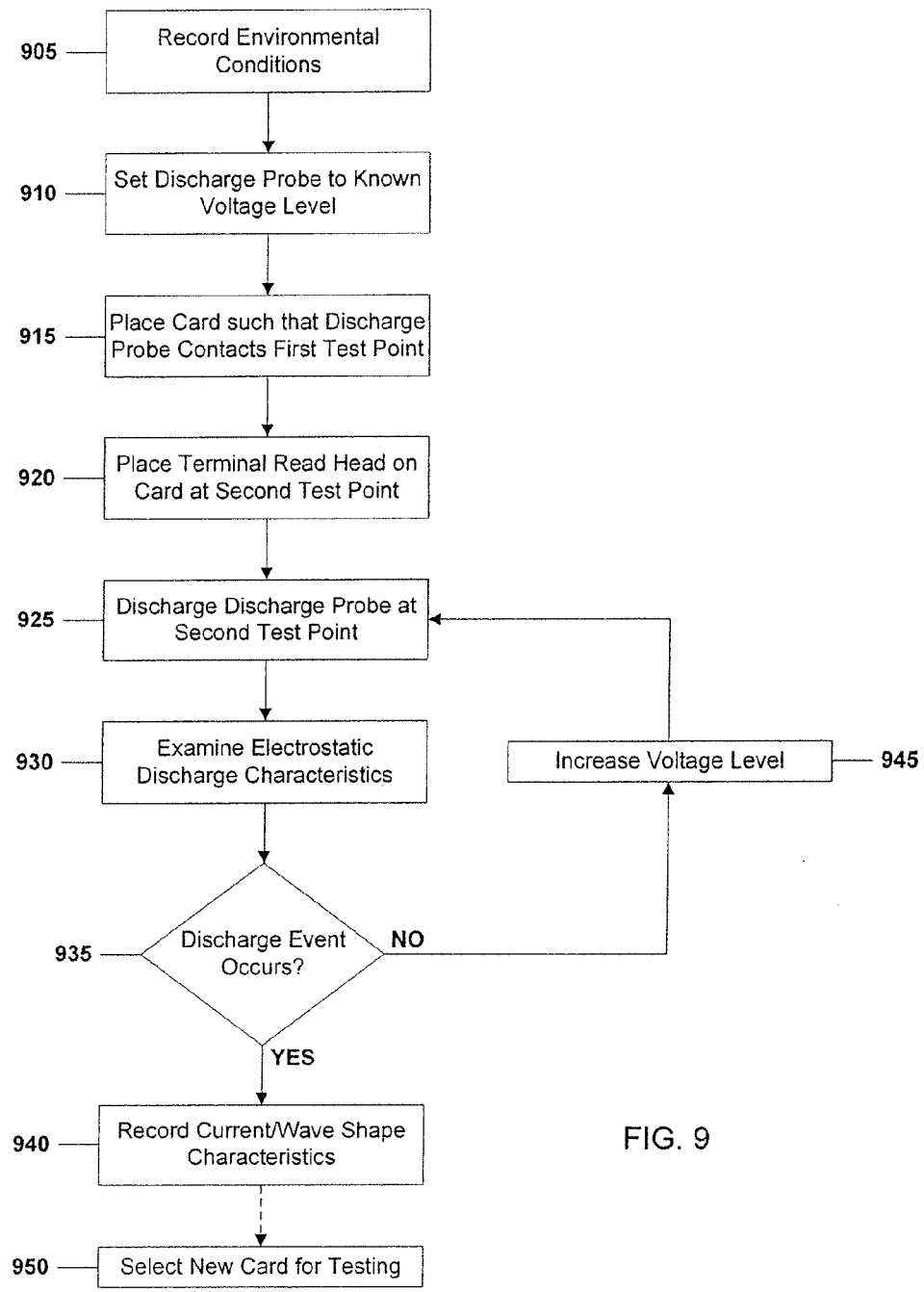
FIG. 9 depicts an exemplary method for performing an ESD on a grounded read head test according to an embodiment.

FIG. 9 depicts an exemplary method for performing an ESD on a grounded read head test according to an embodiment. As shown in FIG. 9, environmental conditions, such as the relative humidity and the temperature, may be recorded 905 prior to, during and/or after the test. A card 405 may be placed on the insulated surface 410. The voltage level of the discharge probe 420 may be adjustable. For example, the discharge probe 420 may initially be set 910 to approximately −5 kV. When placing the discharge probe 420 on the card 405, the discharge probe may be placed 915 at a first test point. A test operator may hold the card 405 and touch the surface 410 when the discharge probe 420 is placed 915 at the first test point in order to charge the card and the operator to the same output potential. The terminal read head 805 may then be placed 920 on the card 405 at a second test point. In an embodiment, the first and second test points may be selected based on one of the Test Zones defined by, for example, Zones 1, 2 and 3.

The ground line connected to the shell of the terminal read head 805 may be examined 930 during discharge 925 from the discharge probe 420 to determine 935 whether a discharge event occurs (i.e., to determine whether the current level is non-zero during the discharging of the discharge probe). If a discharge event occurs, the voltage level ($V_{ESD1}$, the peak current and/or the discharge wave shape of the current at a pin of the terminal read head 805 and/or the voltage level of the shell of the terminal read head 805 ($V_{ESD2}$) may be recorded 940. Otherwise, the voltage level of the discharge probe 420 may be increased 945 to a different voltage level, such as, for example, approximately 1 kV, 2.5 kV, 5 kV or 10 W. Alternate and/or additional voltage levels for the discharge probe 420 may also be used within the scope of this disclosure. After the voltage level for the discharge probe 420 is increased 945, the discharge probe may again be discharged 925. In an embodiment, each test may be performed a plurality of times. In an embodiment, the card 405 may be ionized prior to performing the test or performing the test at an increased voltage level.

If a discharge event occurs or no discharge event occurs at a maximum test voltage, a new card 405 may be selected 950 for testing. In an embodiment, a plurality of test cards and a plurality of control cards may be tested. In an embodiment, the plurality of control cards may include a plurality of pass criteria cards and a plurality of fail criteria cards. In an embodiment, the test may be performed for each Test Zone defined by Zones 1, 2 and 3 for each card 405. In an embodiment, a test card 405 may be considered to pass the test if $V_{ESD1}$ of the test card 405 is comparable to $V_{ESD1}$ of the pass criteria card, if $V_{ESD2}$ of the test card is comparable to $V_{ESD2}$ of the pass criteria card, and if no significant difference is noted between the discharge waveforms for the test card and the discharge waveforms for the pass criteria card. Additional and/or alternate criteria, including different values where applicable, may be used within the scope of this disclosure as will be apparent to one of ordinary skill in the art.

Figure 10A:
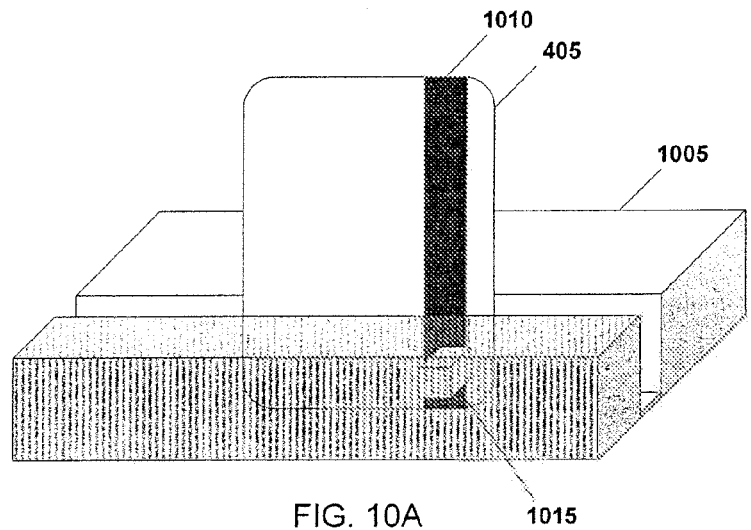
FIGS. 10A and 10B depict a fourth exemplary test setup for performing a test according to an embodiment.
Figure 10B:
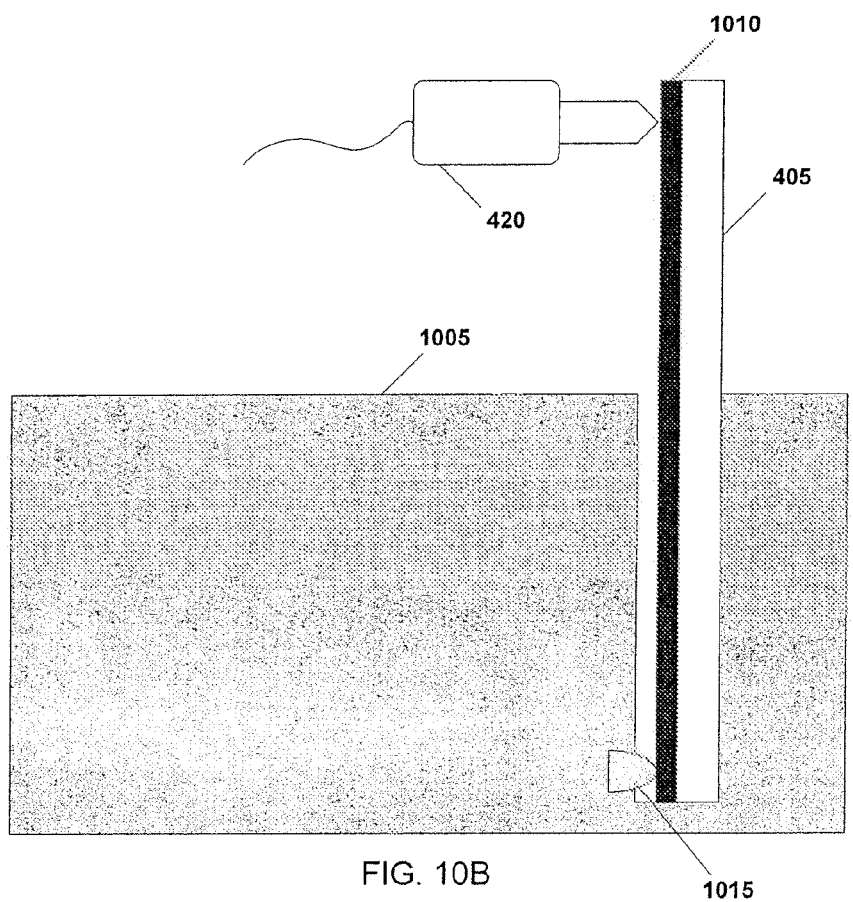

FIGS. 10A and 10B depict a fourth exemplary test setup for performing a test according to an embodiment. As shown in FIGS. 10A and 10B, a card 405 may be inserted in a card reader (terminal) 1005 during testing. The card 405 may be charged using a discharge probe 420 prior to swiping the card through the terminal 1005. A first test point, such as on a card stripe 1010 on the card 405, may contact a terminal read head 1015 to determine if the charge on the card causes an abnormality to occur with the terminal 1005. In an embodiment, the card 405 may be held by a test operator when charged and during testing.

Figure 11:
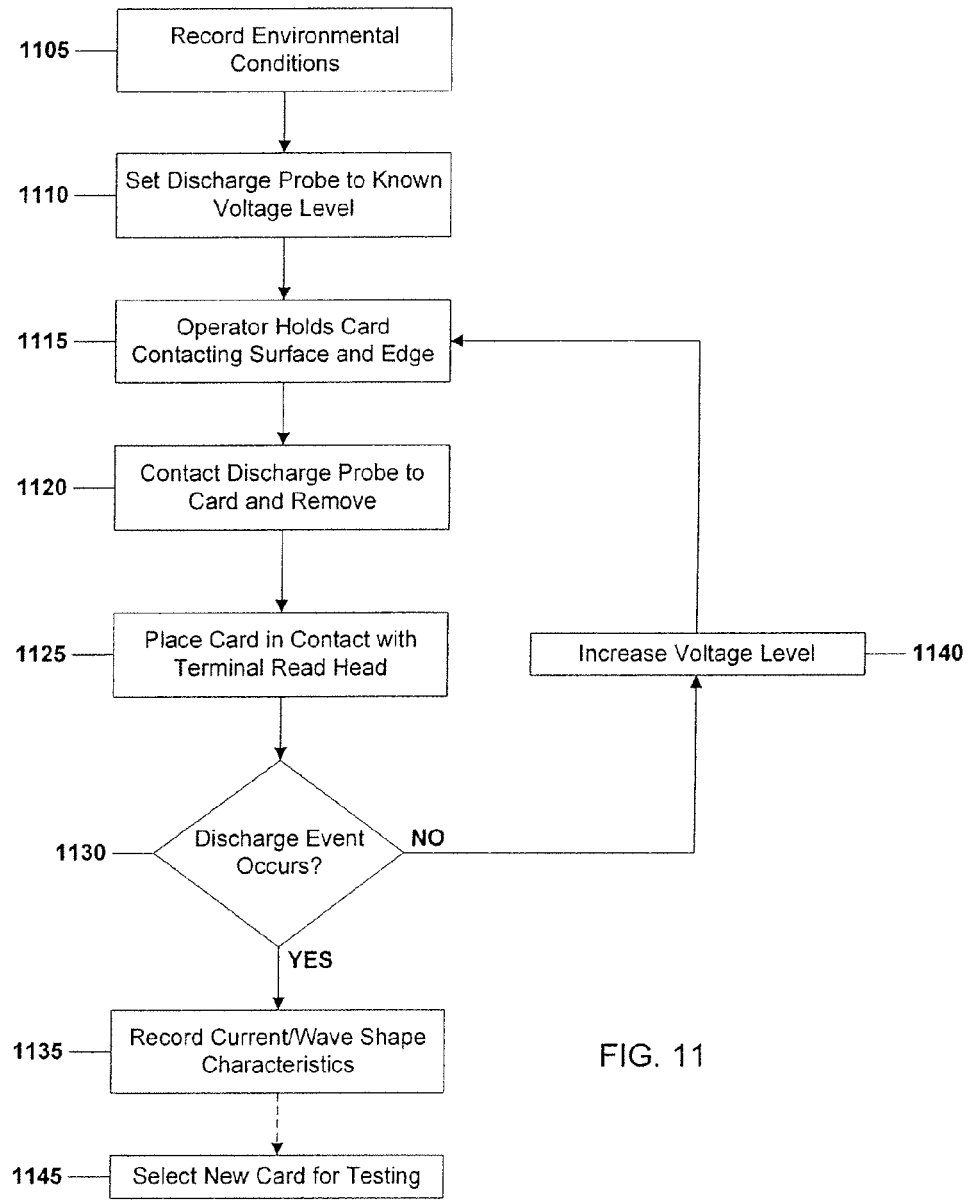
FIG. 11 depicts an exemplary method for performing a simulated discharge via a human body test according to an embodiment.

FIG. 11 depicts an exemplary method for performing a simulated discharge via a human body test according to an embodiment. As shown in FIG. 11, environmental conditions, such as the relative humidity and the temperature, may be recorded 1105 prior to, during and/or after the test. The discharge probe 420 maybe charged 1110 to an initial voltage level, such as approximately −500 V. A test operator may then hold 1115 a card 405 such that the operator contacts the surface and edge of the card. The test operator may then contact 1120 the card 405 with the discharge probe 420 to electrostatically charge the card. After the card 405 is charged, the discharge probe 420 may be removed from contact with the card, and the card may be inserted into a terminal 1005 such that at least a portion of the card's magnetic stripe 1010 contacts 1125 the terminal read head 1015. The test operator may determine 1130 whether the terminal 1005 reboots, reinitializes, freezes or exhibits any other abnormality when the card 405 contacts 1125 the terminal read head 1015. If so, the voltage to which the card 405 was charged ($V_{EST}$) may be recorded 1135. Otherwise, the voltage level of the card 405 may be increased 1140 to a different voltage level, such as, for example, approximately 1 kV, 2.5 kV, 5 kV or 10 kV, and the above test may be repeated. In an embodiment, the card 405 may be ionized prior to performing a subsequent iteration of the test on the card. In an embodiment, a card 405 may be tested a plurality of times when charged to a particular voltage level. In an embodiment, a plurality of cards 405, such as one or more cards to be tested, one or more pass criteria cards and/or one or more fail criteria cards, may be tested 1145. A test card 405 may be considered to pass if the $V_{ESD}$ of the test card is comparable to the $V_{ESD}$ of a pass criteria card. Additional and/or alternate criteria, including different values where applicable, may be used within the scope of this disclosure as will be apparent to one of ordinary skill in the art.

Figure 12A:
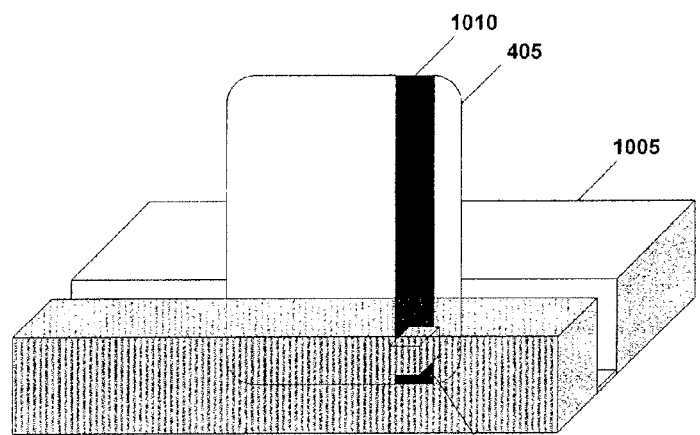
FIGS. 12A and 12B depict a fifth exemplary test setup for performing a test according to an embodiment.
Figure 12B:
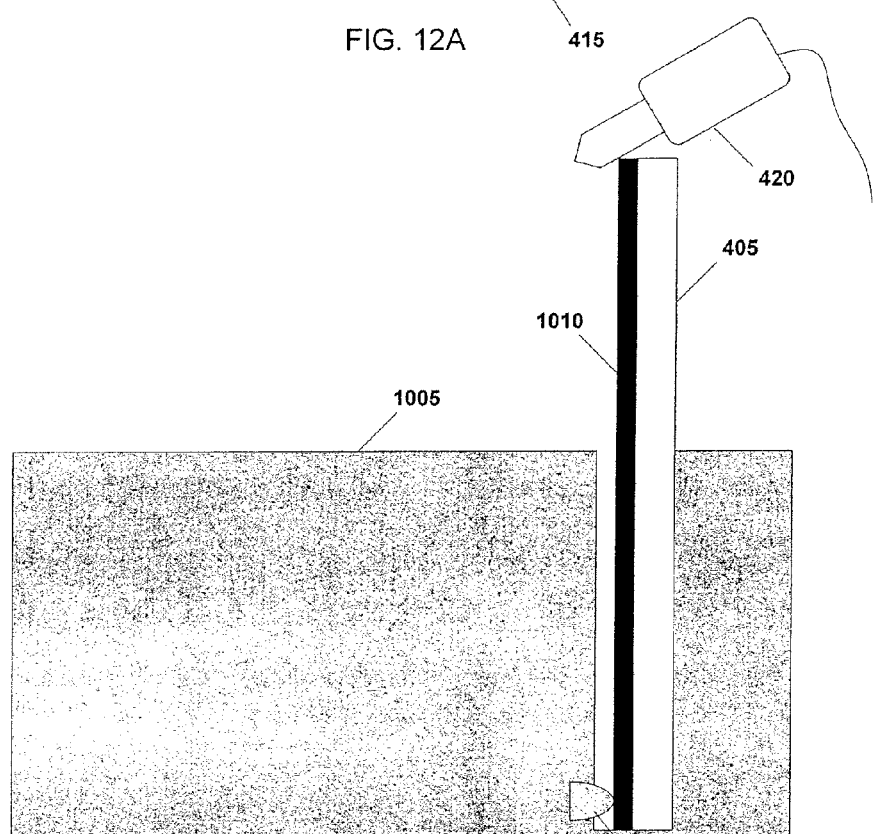

FIGS. 12A and 12B depict a fifth exemplary test setup for performing a test according to an embodiment. As shown in FIGS. 12A and 12B, a card 405 may be inserted in a terminal 1005 during testing. The card 405 may be charged using a discharge probe 420 prior to swiping the card through the terminal 1005. A first test point, such as a on a card stripe 1010 on the card 405, may contact a grounding probe 415 placed within the terminal 1005. In an embodiment, the card 405 may be held by a test operator when charged and during testing.

Figure 13:
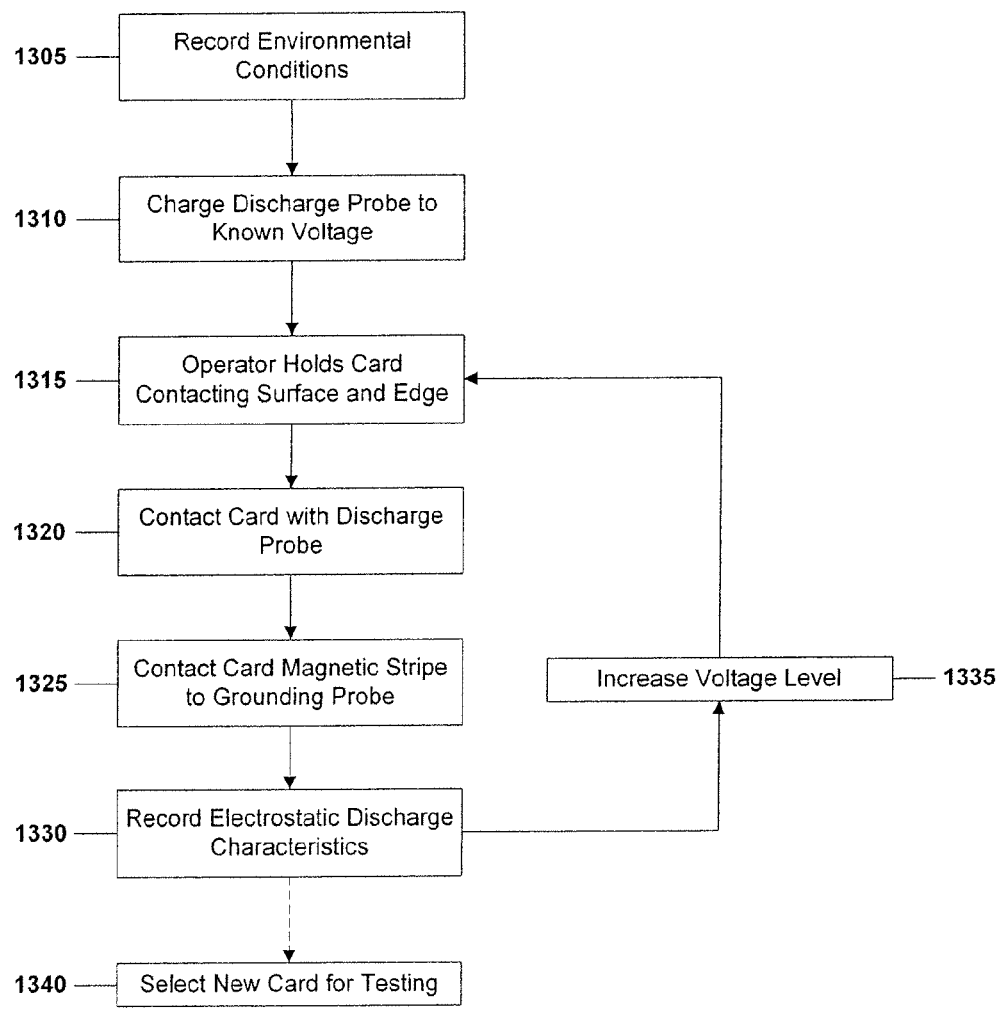
FIG. 13 depicts an exemplary method for performing a conductivity test according to an embodiment.

FIG. 13 depicts an exemplary method for performing a simulated discharge via a human body test according to an embodiment. As shown in FIG. 13, environmental conditions, such as the relative humidity and the temperature, may be recorded 1305 prior to, during and/or after the test. The discharge probe 420 may be charged 1310 to an initial voltage level, such as approximately −500 V. A test operator may then hold 1315 a card 405 such that the operator contacts the surface and the edge of the card. The test operator may then contact 1320 the card 405 with the discharge probe 420 to electrostatically charge the card. After the card 405 is charged, the discharge probe 420 may be removed from the card, and the card may be inserted into a terminal 1005 such that a portion of the card's magnetic stripe 1010 contacts 1325 the grounding probe 415. The peak voltage and voltage and/or current waveforms may be recorded 1330 from the grounding probe 415. The voltage level of the card 405 may be increased 1335 to a different voltage level, such as, for example, approximately 1 kV, 2.5 kV, 5 kV or 10 kV, and the above test may be repeated. In an embodiment, the test may be repeated at increasing voltages until disruption. In an embodiment, the card 405 may be ionized prior to performing a subsequent iteration of the test. In an embodiment, a card 405 may be tested a plurality of times at a particular voltage. In an embodiment, a plurality of cards 405, such as one or more cards to be tested, one or more pass criteria cards and/or one or more fail criteria cards, may be tested 1340. A test card 405 may be considered to pass if the $V_{ESD}$ of the test card is comparable to the $V_{ESD}$ of a pass criteria card. Additional and/or alternate criteria, including different values where applicable, may be used within the scope of this disclosure as will be apparent to one of ordinary skill in the art.

Figure 14:
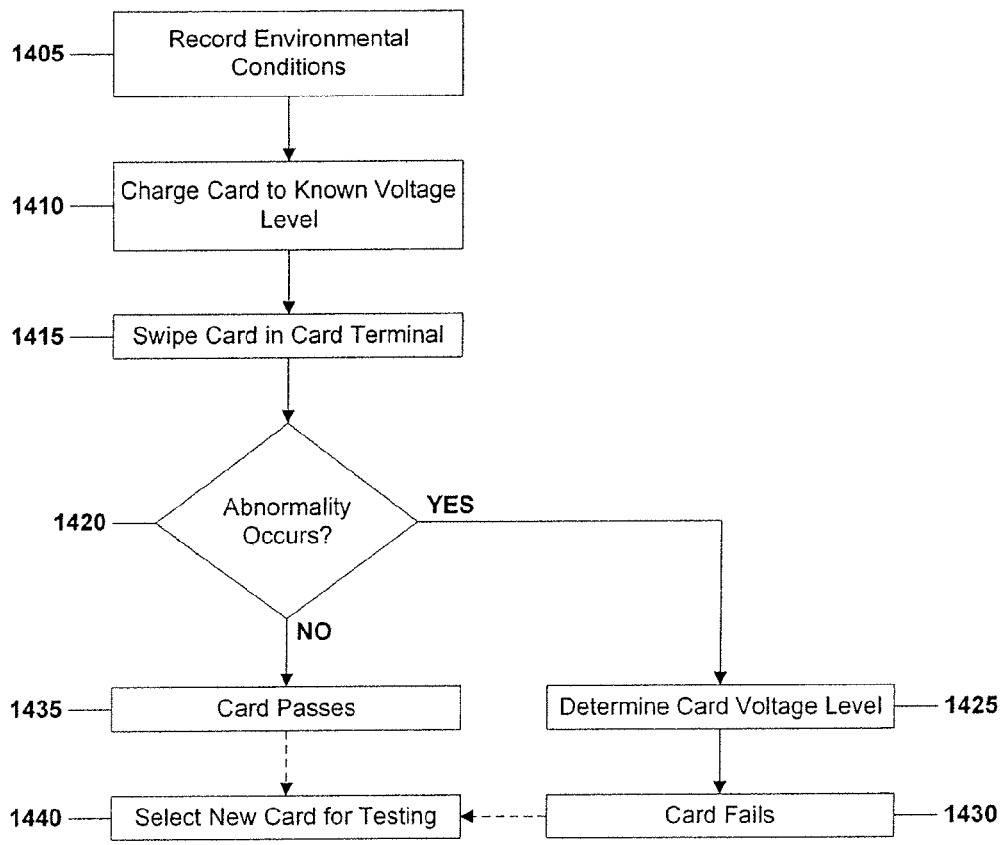
FIG. 14 depicts an exemplary method for performing a triboelectrification simulation via charge plate test according to an embodiment.

FIG. 14 depicts an exemplary method for performing a triboelectrification simulation via charge plate test according to an embodiment. As shown in FIG. 14, environmental conditions, such as the relative humidity and the temperature, may be recorded 1405 prior to, during and/or after the test. The card 405 may be charged 1410 to a voltage level, such as approximately 30 kV, using, for example, a corona charging apparatus (not shown). The card 405 may then be swiped 1415 in a terminal. A test operator may determine 1420 whether the terminal reboots, reinitializes, freezes or exhibits any other abnormality when the card 405 is swiped 1415. A card voltage level at which the terminal exhibits an abnormality, if any, may be determined 1425. The test card 405 may be considered 1430 to fail if an abnormality is exhibited by the terminal. Otherwise, the card may be considered to pass 1435. In an embodiment, the card 405 may be ionized between test iterations. A card 405 may be tested using the above process a plurality of times. In an embodiment, a plurality of cards 405, such as one or more cards to be tested, one or more pass criteria cards and/or one or more fail criteria cards, may be tested 1440. Additional and/or alternate criteria, including different values where applicable, may be used within the scope of this disclosure as will be apparent to one of ordinary skill in the art.

Figure 15:
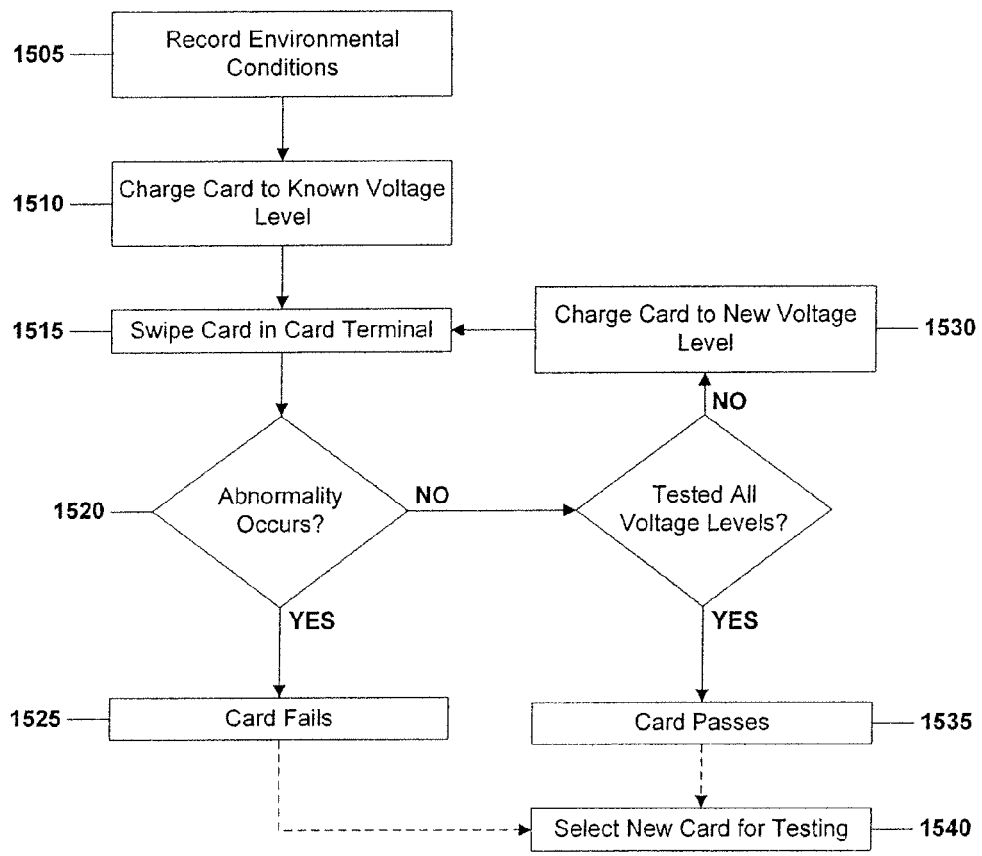
FIG. 15 depicts an exemplary method for performing a charged card simulation test according to an embodiment.

FIG. 15 depicts an exemplary method for performing a charged card simulation test according to an embodiment. As shown in FIG. 15, environmental conditions, such as the relative humidity and the temperature, may be recorded 1505 prior to, during and/or after the test. A magnetic stripe on a card 405 may be charged 1510 to an initial voltage level, such as approximately −500 V. The card may then be swiped 1515 in a terminal. A test operator may determine 1520 whether the terminal reboots, reinitializes, freezes or exhibits any other abnormality when the card 405 is swiped 1515. If an abnormality occurs with the terminal, the magnetic stripe voltage at which the abnormality occurs may be recorded and the card 405 may be considered 1525 to fail. The card 405 may be ionized after being swiped 1515. The test may be repeated a plurality of times for each card 405 at a particular voltage level. The magnetic stripe on the card 405 may be charged 1530 to a different voltage, such as approximately −1 kV, −2.5 kV, −5 kV, −10 kV, 500 V, 1 kV, 2.5 kV, 5 kV or 10 kV, prior to performing the test again. The test card 405 may be considered 1535 to pass if no abnormality is exhibited by the terminal. In an embodiment, a plurality of cards 405, such as one or more cards to be tested, one or more pass criteria cards and/or one or more fail criteria cards, may be tested 1540. Additional and/or alternate criteria, including different values where applicable, may be used within the scope of this disclosure as will be apparent to one of ordinary skill in the art.

Figure 16:
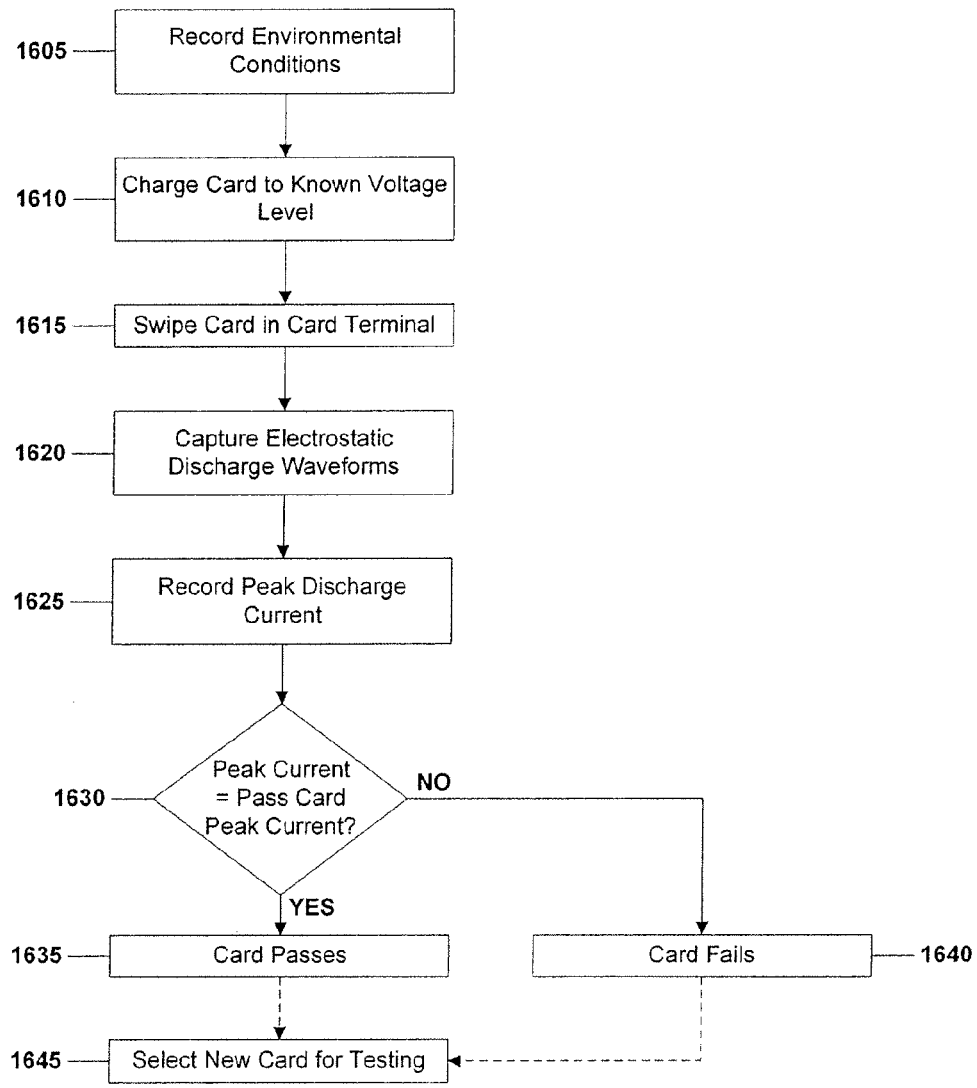
FIG. 16 depicts an exemplary method for performing a card charging level test according to an embodiment.

FIG. 16 depicts an exemplary method for performing a card charging level test according to an embodiment. As shown in FIG. 16, environmental conditions, such as the relative humidity and the temperature, may be recorded 1605 prior to, during and/or after the test. A card 405 may be charged 1610 by rubbing it against, for example and without limitation, another card, leather, nylon, cotton and/or one or more other materials. The card 405 may then be swiped 1615 in a terminal. The terminal may include a simulated read head. Electrostatic discharge waveforms may be captured 1620, and the peak discharge current may be recorded 1625. If the peak discharge current for the test card 405 is determined 1630 to be substantially similar to a pass criteria card and/or substantially dissimilar from a fail criteria card, the test card may be considered 1635 to pass. Otherwise, the test card 405 may be considered 1640 to fail. In an embodiment, a plurality of cards 405, such as one or more cards to be tested, one or more pass criteria cards and/or one or more fail criteria cards, may be tested 1645. In an embodiment, each card 405 may be tested a plurality of times. Additional and/or alternate criteria, including different values where applicable, may be used within the scope of this disclosure as will be apparent to one of ordinary skill in the art.

Figure 17:
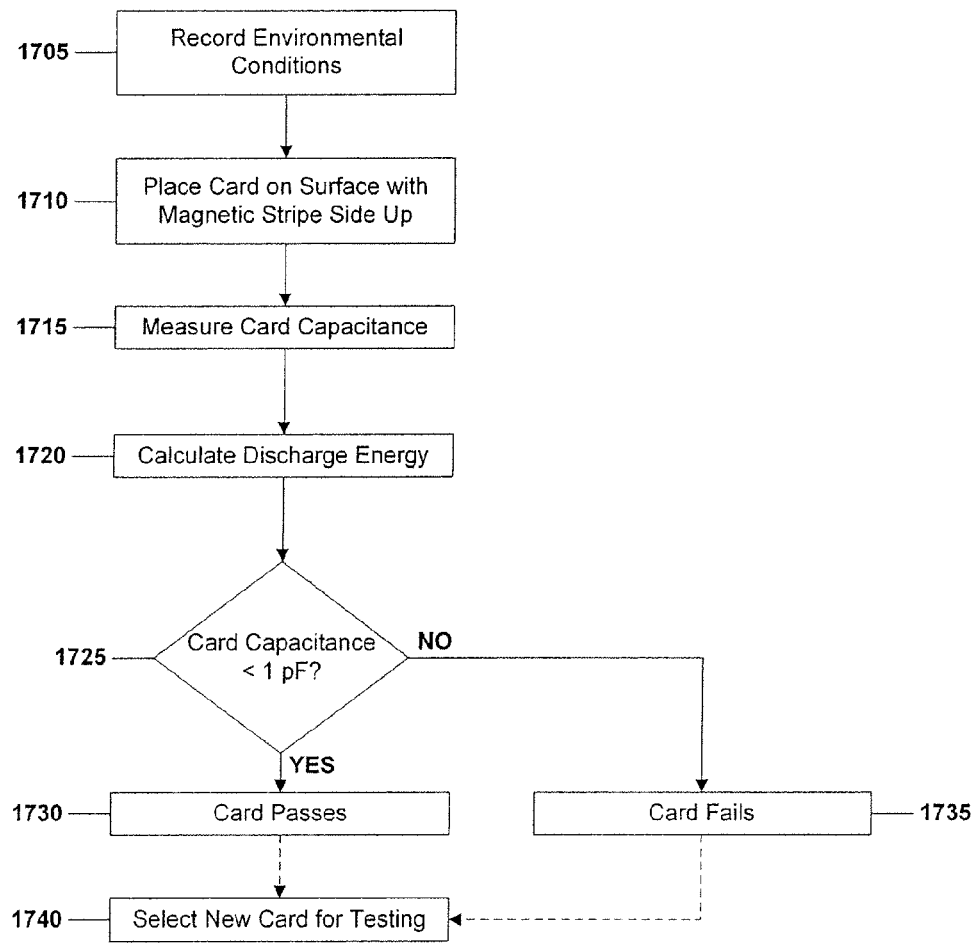
FIG. 17 depicts an exemplary method for performing a card capacitance and discharge energy test according to an embodiment.

FIG. 17 depicts an exemplary method for performing a card capacitance and discharge energy test according to an embodiment. As shown in FIG. 17, environmental conditions, such as the relative humidity and the temperature, may be recorded 1705 prior to, during and/or after the test. A card 405 may be placed 1710 such that the side of the card that does not include the magnetic stripe contacts a flat metal surface. A capacitance meter (not shown) may be connected to the flat metal surface and the stripe of the card 405 to measure 1715 the capacitance of the card. The discharge energy for the card 405 may be calculated 1720 using, for example, the following equation:

$$E = \frac{CV^2}{2} = 6.25 \times 10^6 C,$$

where C is the capacitance for the card. It may then be determined 1725 whether the card capacitance is less than a threshold value, such as approximately 1 pF. If so, the test card 405 may be considered 1730 to pass. Otherwise, the test card 405 may be considered to fail 1735. The test may be repeated 1740 for each card to be tested. Additional and/or alternate criteria, including different values where applicable, may be used within the scope of this disclosure as will be apparent to one of ordinary skill in the art.

It will be appreciated that various of the above-disclosed and other features and functions, or alternatives thereof, may be desirably combined into many other different systems or applications. Also, it will be appreciated that various presently unforeseen or unanticipated alternatives, modifications, variations or improvements therein may be subsequently made by those skilled in the art that. Such alternatives, modifications, variations and improvements are also intended to be encompassed by the following claims.

What is claimed is:

1. A method of performing electrostatic discharge testing on a transaction card, the method comprising:
   charging a discharge probe to a known voltage level;
   discharging, at a first location on the transaction card, the discharge probe onto a transaction card held by an operator, to charge the transaction card and the operator to the known voltage level;
   placing the transaction card in contact with a read head of a terminal at a second location on the transaction card;
   determining whether the terminal exhibits an abnormality; and
   if so, assigning one of a pass condition and a fail condition to the transaction card based on at least the value of the known voltage level as compared to a reference voltage level.

2. The method of claim 1 wherein the abnormality comprises one or more of rebooting the terminal, reinitializing the terminal, and suspending operation of the terminal.

3. The method of claim 1 wherein the first location comprises a first point on a magnetic stripe of the transaction card within a zone located between 0 and 1.0 cm from a first edge of the transaction card, wherein the second location comprises a second point on the magnetic stripe within a zone located between 0 and 1.0 cm from a second edge of the transaction card, wherein the second edge of the transaction card is opposite the first edge of the transaction card.

4. The method of claim 1 wherein the known voltage level comprises a voltage level between −1000 volts and 10000 volts.

5. The method of claim 1 wherein the reference voltage level is based on a voltage at which a carbon-based magnetic stripe card fails.

6. A method of performing electrostatic discharge testing on a transaction card, the method comprising: charging a discharge probe to a known voltage level;
   discharging, at a first location on the transaction card, the discharge probe onto a transaction card held by an operator to charge the transaction card and the operator to the known voltage level;
   placing the transaction card in contact with a read head of a terminal at a second location on the transaction card;
   recording a peak voltage and a voltage wave shape at the read head; and
   assigning one of a pass condition and a fail condition to the transaction card based on at least the value of the known voltage level as compared to a reference voltage level.

7. The method of claim 6 wherein the first location comprises a first point on a magnetic stripe of the transaction card within a zone located between 0 and 1.0 cm from a first edge of the transaction card, wherein the second location comprises a second point on the magnetic stripe within a zone located between 0 and 1.0 cm from a second edge of the transaction card, wherein the second edge of the transaction card is opposite the first edge of the transaction card.

8. The method of claim 6 wherein the known voltage level comprises a voltage level between −1000 volts and 10000 volts.

9. The method of claim 6 wherein the reference voltage level is based on a voltage at which a carbon-based magnetic stripe card fails.

10. A method of performing electrostatic discharge testing on a transaction card, the method comprising:
    charging a transaction card and its operator to a known voltage level;
    placing the transaction card in contact with a read head of a terminal at a location on the transaction card;
    swiping the transaction card through the terminal;

determining whether the terminal exhibits an abnormality; and assigning one of a pass condition and a fail condition to the transaction card based on whether an abnormality occurs in the terminal and based on at least the value of the known voltage level as compared to a reference voltage level.

11. The method of claim 10 wherein the abnormality comprises one or more of rebooting the terminal, reinitializing the terminal, and suspending operation of the terminal.

12. The method of claim 10 wherein the known voltage comprises 30000 volts.

13. A method of performing electrostatic discharge testing on a transaction card, the method comprising:
   charging a magnetic stripe on a transaction card and its operator to a known voltage level;
   placing the transaction card in contact with a read head of a terminal at a location on the transaction card;
   swiping the transaction card through the terminal;
   determining whether the terminal exhibits an abnormality; and
   assigning one of a pass condition and a fail condition to the transaction card based on whether an abnormality occurs in the terminal and based on at least the value of the known voltage level as compared to a reference voltage level.

14. The method of claim 13 wherein the abnormality comprises one or more of rebooting the terminal, reinitializing the terminal, and suspending operation of the terminal.

15. The method of claim 13 wherein the known voltage comprises a voltage level between −10000 volts and 10000 volts.

16. A method of performing electrostatic discharge testing on a transaction card, the method comprising:
   rubbing the transaction card held by an operator against a conductive material to charge the transaction card and the operator to a known voltage level;
   placing the transaction card in contact with a read head of a terminal at a location on the transaction card;
   swiping the transaction card through the terminal;
   determining whether the terminal exhibits an abnormality; and
   assigning one of a pass condition and a fail condition to the transaction card based on whether an abnormality occurs in the terminal and based on at least the value of the known voltage level as compared to a reference voltage level.

17. The method of claim 16 wherein the conductive material comprises one or more of a plastic, leather, nylon, and cotton.

18. The method of claim 16 wherein the abnormality comprises one or more of rebooting the terminal, reinitializing the terminal, and suspending operation of the terminal.

19. The method of claim 16 wherein swiping the transaction card through a terminal comprises placing the transaction card in contact with a read head of a terminal, and further comprising recording a peak voltage and a voltage wave shape at the read head.

* * * * *